United States Patent
Kim et al.

(10) Patent No.: US 11,439,026 B2
(45) Date of Patent: Sep. 6, 2022

(54) PRINTED CIRCUIT BOARD

(71) Applicant: Samsung Electro-Mechanics Co., Ltd., Suwon-si (KR)

(72) Inventors: Jung-Soo Kim, Suwon-si (KR); Jin-Won Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 151 days.

(21) Appl. No.: 16/798,567

(22) Filed: Feb. 24, 2020

(65) Prior Publication Data
US 2020/0404796 A1   Dec. 24, 2020

(30) Foreign Application Priority Data
Jun. 24, 2019 (KR) .................. 10-2019-0075113

(51) Int. Cl.
*H05K 3/42* (2006.01)
*H05K 1/11* (2006.01)

(52) U.S. Cl.
CPC .............. *H05K 3/427* (2013.01); *H05K 1/11* (2013.01); *H05K 3/423* (2013.01); *H05K 2201/0959* (2013.01)

(58) Field of Classification Search
CPC .......... H05K 1/11; H05K 3/423; H05K 3/427; H05K 2201/09594
See application file for complete search history.

(56) References Cited

U.S. PATENT DOCUMENTS

| | | | | |
|---|---|---|---|---|
| 4,104,111 A * | 8/1978 | Mack | ...................... | H05K 3/062 216/18 |
| 4,278,511 A * | 7/1981 | Dugan | ...................... | C25D 5/02 205/150 |
| 4,303,798 A * | 12/1981 | Paunovic | ................. | H05K 3/24 174/257 |
| 4,374,003 A * | 2/1983 | Dugan | ................. | H05K 3/4092 205/75 |
| 4,374,708 A * | 2/1983 | Dugan | ................. | H05K 3/4092 205/75 |
| 4,487,654 A * | 12/1984 | Coppin | ................ | B23K 35/001 205/125 |
| 4,649,338 A * | 3/1987 | Dugan | ............... | G01R 1/06711 324/72.5 |
| 4,720,324 A * | 1/1988 | Hayward | ............... | H05K 3/062 205/166 |
| 6,370,768 B1 * | 4/2002 | Itabashi | ................. | H05K 3/422 29/852 |
| 6,512,186 B1 * | 1/2003 | Nishiwaki | .............. | H05K 3/384 174/261 |

(Continued)

FOREIGN PATENT DOCUMENTS

| JP | 07099389 A * | 4/1995 |
|---|---|---|
| JP | 3602565 B2 * | 12/2004 |

(Continued)

*Primary Examiner* — Carl J Arbes
(74) *Attorney, Agent, or Firm* — NSIP Law

(57) ABSTRACT

A method for manufacturing a printed circuit board includes forming a through hole in an insulating layer of the printed circuit board, filling the through hole by plating to form a plating layer on the insulating layer, and removing the plating layer from the insulating layer; and forming a circuit pattern on the insulating layer.

10 Claims, 4 Drawing Sheets

(56) References Cited

U.S. PATENT DOCUMENTS

| | | | |
|---|---|---|---|
| 7,726,016 B2* | 6/2010 | Ohsumi | H05K 3/427 |
| | | | 29/852 |
| 7,855,454 B2* | 12/2010 | Akram | C23C 18/1607 |
| | | | 257/750 |
| 10,834,810 B2* | 11/2020 | Trageser | H05K 3/061 |
| 2009/0260868 A1 | 10/2009 | Oh et al. | |

FOREIGN PATENT DOCUMENTS

| | | |
|---|---|---|
| KR | 10-2009-0053625 A | 5/2009 |
| KR | 10-2009-0110596 A | 10/2009 |
| WO | 2018041595 A1 * | 3/2018 |

* cited by examiner

PRINTED CIRCUIT BOARD

CROSS-REFERENCE TO RELATED APPLICATIONS

This application claims the benefit under 35 USC 119(a) of Korean Patent Application No. 10-2019-0075113 filed on Jun. 24, 2019 in the Korean Intellectual Property Office, the entire disclosure of which is incorporated herein by reference for all purposes.

BACKGROUND

1. Field

This following description relates to a method for manufacturing a printed circuit board. The following description also relates to a printed circuit board manufactured using the method.

2. Description of Related Art

There has been an increased demand for multi-functional, small and thin cellular phones and electronic components of information technology (IT). Accordingly, printed circuit board structures having various types of microcircuits have been proposed. In particular, there is a growing demand for successfully increasing the density of circuit patterns.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a printed circuit board includes forming a through hole in an insulating layer of the printed circuit board, filling the through hole by plating to form a plating layer on the insulating layer, removing the plating layer from the insulating layer, and forming a circuit pattern on the insulating layer.

The operation of removing the plating layer may include fully etching, so as to remove all of the plating layer formed on the insulating layer.

The operation of forming a circuit pattern may include forming a seed layer on the insulating layer, forming the circuit pattern on the seed layer by electrolytic plating, and removing the seed layer.

The operation of forming a through hole in the insulating layer may include forming the through hole using a copper clad laminate, and removing a copper foil of the copper clad laminate.

The operation of forming the plating layer may include forming an electroless plating layer on an inner wall of the through hole and on the insulating layer, and electroplating to fill the through hole with a plating, thereby forming an electroplating layer on the insulating layer.

In another general aspect, a printed circuit board includes an insulating layer formed including a through hole, a via including a first plating layer formed on an inner wall of the through hole and a second plating layer formed on the first plating layer and filling the through hole, and a circuit pattern formed on the insulating layer.

The first plating layer may be an electroless plating layer and the second plating layer may be an electroplating layer.

The circuit pattern may include a pad coupled to an end of the via.

The pad may be a third plating layer distinct from the first plated layer and the second plated layer.

In yet another general aspect, a printed circuit board includes an insulating layer formed including a through hole, a via, formed in the through hole, having a first plating layer and a second plating layer, and a circuit pattern formed on the insulating layer, wherein the circuit pattern includes a pad coupled to an end of the via.

The first plating layer may be formed on an inner wall of the through hole.

The second plating layer may be formed on the first plating layer and may fill the through hole.

The insulating layer may electrically insulate the via and the circuit pattern from each other.

An end surface of the via may be coplanar with a surface of the insulating layer.

The pad may be a third plating layer distinct from the first plated layer and the second plated layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
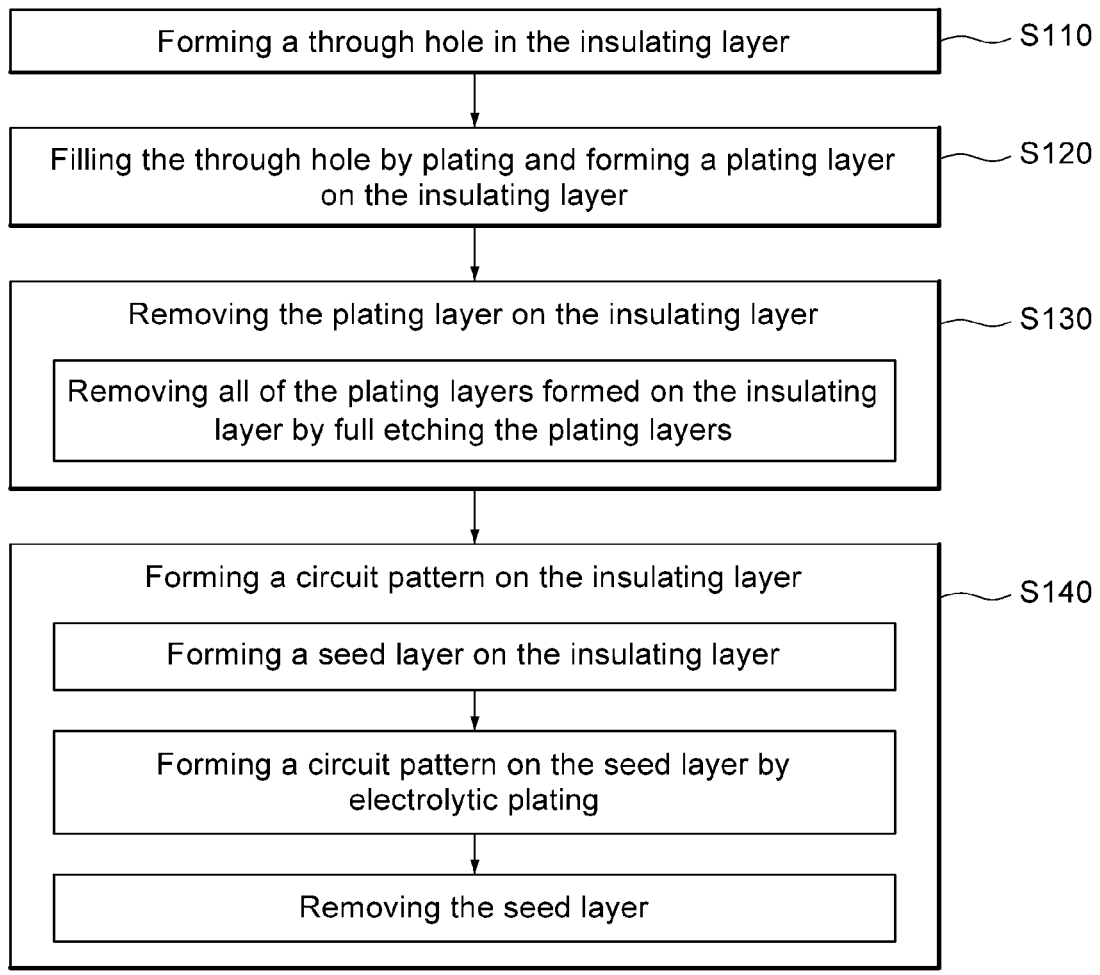
FIG. 1 is a flow diagram illustrating a method for manufacturing a printed circuit board according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

When one element is described as being "connected", "coupled" or "bonded" to another element, it shall be construed as being connected, coupled or bonded to the other element directly but also as possibly having another element in between.

Hereinafter, various examples will be described separately, but it is not excluded that the description of any one example can be applied to other examples. The description of any one example may be applied to other examples as long as the relationship is compatible.

Method for Manufacturing a Printed Circuit Board

FIG. 1 is a flow diagram illustrating a method for manufacturing a printed circuit board according to an example. FIG. 2 to FIG. 9 are corresponding diagrams illustrating a method for manufacturing a printed circuit board.

Referring to the example of FIG. 1, a method of fabricating a printed circuit board according to an aspect of the examples includes forming a through hole in an insulating layer in operation S110, forming a plating layer in operation S120, removing the plating layer in operation S130, and forming a circuit pattern in operation S140.

Operation S110 of forming a through hole in an insulating layer may include forming a through hole 12 passing through the insulating layer 10 in a thickness direction.

Figure 2:
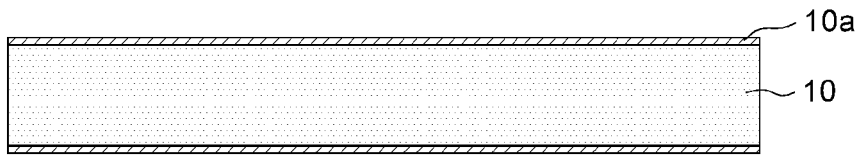
FIG. 2 to FIG. 9 are diagrams illustrating a method for manufacturing a printed circuit board.

Referring to the example of FIG. 2, the insulating layer 10 may be made of an insulating material, such as a material of a copper-clad laminate. However, while the insulating material may be a copper-clad laminate, the insulating material may also be made of appropriate alternative insulating materials with similar properties. The insulating material may be used as the insulating layer 10 by removing copper foils 10a that are formed on both surfaces of the copper-clad laminate.

Figure 3:
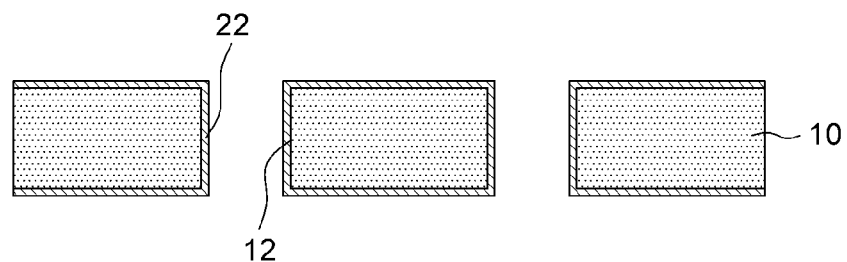

Referring to the example of FIG. 3, the through hole 12 may be formed in a thickness direction of the copper-clad laminate, and the copper foil 10a of the copper clad laminate may be removed to form the insulating layer 10 by exposing the underlying insulating layer 10.

Operation S120 includes forming a plating layer. For example, operation S120 may include filling the through hole 12 with plating material, and forming a plating layer on the insulating layer 10. In operation S120, more than on plating layer may be formed. For example, in such an operation, an electroless plating layer 22 and an electroplating layer 24 may be formed sequentially in the through hole 12.

Referring to the example of FIG. 3, the electroless plating layer 22 may be formed on an inner wall of the through hole 12 and on the insulating layer 10. That is, the electroless plating layer 22 may be formed on exposed surfaces of the insulating layer 10.

Figure 4:
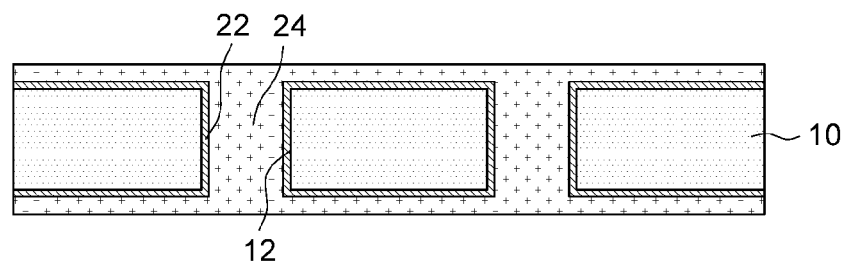

Referring to the example of FIG. 4, electrolytic plating may be performed using the electroless plating layer 22. In such an example, the through hole 12 may be filled with the electroplating layer 24. The electroplating layer 24 may be formed also on the insulating layer 10 by electrolytic plating.

In this example, the plating layer is formed by plating two times, but the plating layer is not limited to plating two times. For example, the plating layer may be formed by plating once or three or more times, rather than by plating twice, in other examples.

Operation S130 of removing the plating layer may include removing the plating layers 22 and 24 on the insulating layer 10. Only the portions of plating layers 22 and 24 formed on both surfaces of the insulating layer 10 may be selectively removed, while leaving the portions of plating layers 22 and 24 formed on the inner wall of the through hole 12 to remain. For example, the plating layers 22 and 24 may be full-etched accordingly to remove all of the plating layers 22 and 24 formed on the insulating layer 10.

Figure 5:
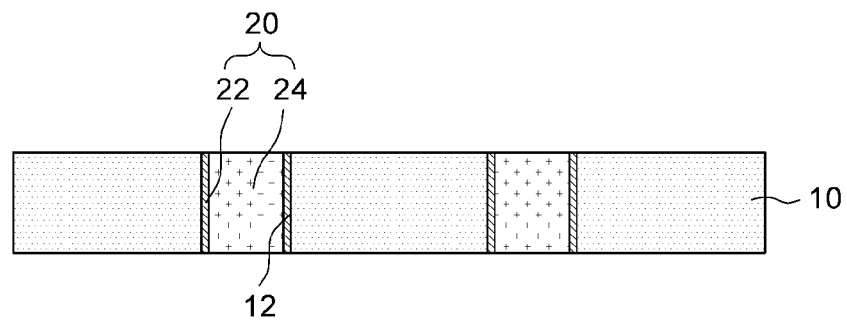

Referring to the example of FIG. 5, the portions of electroless plating layer 22 and the electroplating layer 24 on the insulating layer 10 may be removed from the surface of the insulating layer 10, except for those formed on the inner wall of the through hole 12 by employing full etching. Accordingly, a pad connected to a via 20 passing through the insulating layer 10 may be formed separately from the plating layers 22 and 24. An end face of the via 20 may be formed on a surface that is substantially the same as the surface of the insulating layer 10.

Operation S140 of forming a circuit pattern may include forming a circuit pattern 30 on the insulating layer 10. Because the circuit pattern 30 may be formed separately from the plating layers forming the via 20, the circuit pattern 30 may have a scale finer than that of the via 20.

The circuit pattern 30 may be formed by forming a new plating layer on the insulating layer 10 and by performing a patterning process through selective etching. The circuit pattern 30 may also be formed by applying a conductive metal material onto the insulating layer 10 and then performing a patterning process or a similar process that creates the circuit pattern 30. For example, the patterning process may be a tenting process, a modified semi-additive process (MSAP), or a semi-additive process (SAP), but other patterning processes may be used, as appropriate, in other examples.

Figure 6:
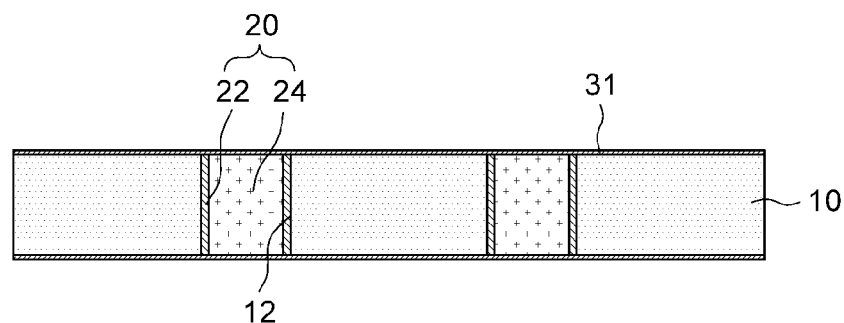

Referring to the example of FIG. 6, a new seed layer 31 may be formed on the exposed insulating layer 10 from which the plating layers 22 and 24 are removed.

Figure 7:
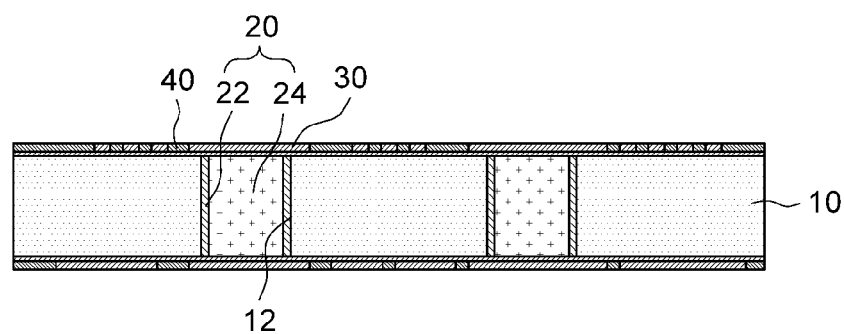

Referring to the example of FIG. 7, a plating resist 40 may be selectively formed on the seed layer 31. The circuit pattern 30 may be formed by electrolytic plating.

Figure 8:
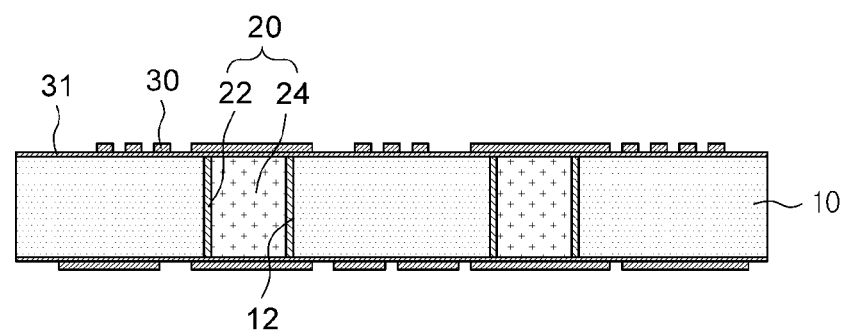
Figure 9:
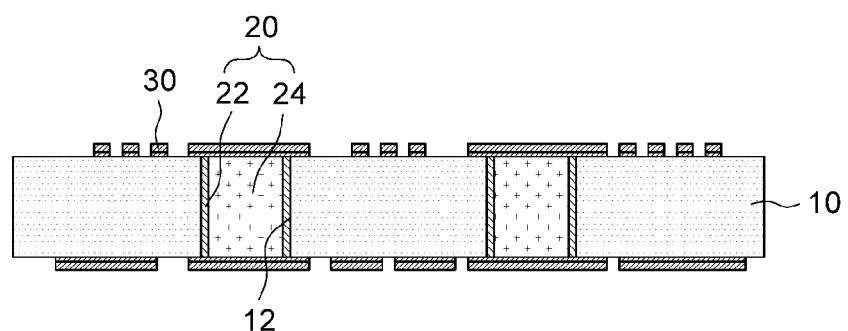

Referring to the examples of FIG. 8 and FIG. 9, after removing the plating resist 40, the seed layer 31 may be removed to separate the circuit pattern 30. In these examples, the seed layer 31 may be removed through an etching such as a flash etching, but other appropriate alternative etching processes may be used in other examples.

As described above, the method of manufacturing a printed circuit board, according to an example, completely removes plating on the surface of the insulating layer 10 after the via 20 penetrating the insulating layer 10 are formed. Thus, the precise circuit pattern 30 may be formed from the new seed layer 31 on the surface of the insulating layer 10.

Printed Circuit Board

Figure 10:
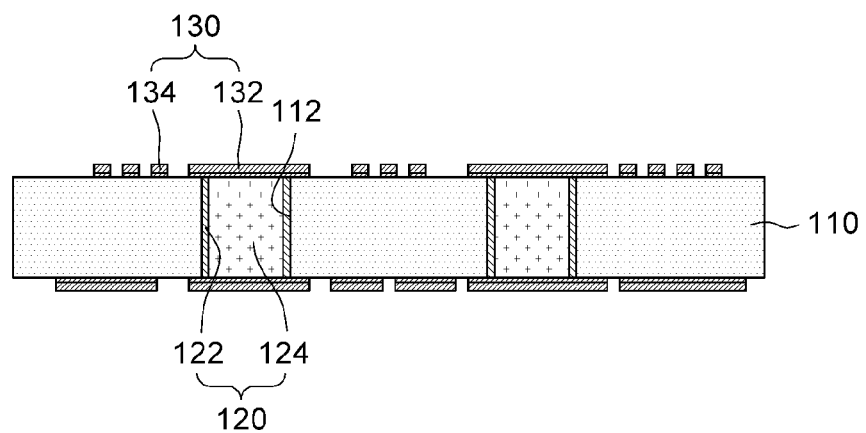
FIG. 10 is a diagram illustrating a printed circuit board according to an example.

FIG. 10 is a diagram illustrating a printed circuit board according to another aspect of the examples.

Referring to the example of FIG. 10, a printed circuit board may include an insulating layer 110, a via 120, and a circuit pattern 130.

The insulating layer 110 may electrically insulate the via 120 and the circuit pattern 130 of the printed circuit board from each other. The insulating layer 110 may be a resin material. For example, the insulating layer 110 may include a thermosetting resin such as an epoxy resin or a thermoplastic resin such as polyimide (PI), and may be formed of a prepreg (PPG) or a build-up film. However, these are only examples, and other appropriate materials may be used in other examples.

In the example of FIG. 10, a through hole 112 may be formed in the insulating layer 110.

Referring to the example of FIG. 10, the through-hole 112 may be formed in the insulating layer 110 so as to penetrate through the insulating layer 110 in a thickness direction. Also, the through-hole may be opened to both surfaces of the insulating layer 110.

The via 120 may electrically connect the circuit patterns 130 on both surfaces of the insulating layer 110, and may have a shape such that the via 120 is located in the area of the through hole 112. The via 120 of this example may include a first plating layer 122 formed on an inner wall of the through hole 112 and a second plating layer 124 formed on the first plating layer 122 and filling the through hole 112.

Referring to the example of FIG. 10, the first plating layer 122 formed on an inner wall of the through hole 112 may be an electroless plating and the second plating layer 124 formed on the first plating layer 122 and filling the through holes 112 may be an electroplating layer. Accordingly, a thin electroless plating layer may be formed along the inner wall of the through hole 112. Most of the inside of the through hole 112 may be filled with the electroplating layer.

In the example of FIG. 10, an end surface of the via 120 may be formed on a surface that is substantially the same as the surface of the insulating layer 110.

The circuit pattern 130 may be formed of a metal, such as copper, to which an electrical signal is able to be transmitted. However, other appropriate materials besides copper may also be used for the circuit pattern 130. The circuit pattern 130 of this embodiment may be formed on the insulating layer 110. Also, the circuit pattern 130 may include a pad 132 and a wiring pattern 134 connected to the via 120.

Referring to the example of FIG. 10, the pad 132 may be disposed on one surface of the insulating layer 110 with a protruding structure. Here, the pad 132 may be coupled to an end of the via 120. The pad 132 may be coupled to an end surface of the via 120 formed on a surface that is substantially the same as one surface of the insulating layer 110, and the pad 132 may extend to one surface of the insulating layer 110.

Here, the pad 132 may be formed as a third plating layer that is distinguished from the first plating layer 122 and the second plating layer 124 forming the via 120.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
an insulating layer formed comprising a through hole;

a via comprising a first plating layer formed on an inner wall of the through hole and a second plating layer formed on the first plating layer and filling the through hole; and a circuit pattern formed on the insulating layer, wherein upper surfaces of the insulating layer, the first plating layer, and the second plating layer are coplanar.

2. The printed circuit board of claim 1, wherein the first plating layer is an electroless plating layer and the second plating layer is an electroplating layer.

3. The printed circuit board of claim 1, wherein the circuit pattern comprises a pad coupled to an end of the via.

4. The printed circuit board of claim 3, wherein the pad is a third plating layer distinct from the first plated layer and the second plated layer.

5. A printed circuit board comprising:

an insulating layer formed comprising a through hole;

a via, formed in the through hole, having a first plating layer and a second plating layer; and a circuit pattern formed on the insulating layer, wherein the circuit pattern comprises a pad coupled to an end of the via, wherein upper surfaces of the insulating layer, the first plating layer, and the second plating layer are coplanar.

6. The printed circuit board of claim 5, wherein the first plating layer is formed on an inner wall of the through hole.

7. The printed circuit board of claim 5, wherein the second plating layer formed on the first plating layer and filling the through hole.

8. The printed circuit board of claim 5, wherein the insulating layer electrically insulates the via and the circuit pattern from each other.

9. The printed circuit board of claim 5, wherein an end surface of the via is coplanar with a surface of the insulating layer.

10. The printed circuit board of claim 5, wherein the pad is a third plating layer distinct from the first plated layer and the second plated layer.

* * * * *